US006972983B2

(12) United States Patent
Roehr et al.

(10) Patent No.: US 6,972,983 B2
(45) Date of Patent: Dec. 6, 2005

(54) INCREASING THE READ SIGNAL IN FERROELECTRIC MEMORIES

(75) Inventors: Thomas Roehr, Yokohama (JP); Hans-Oliver Joachim, Kanagawa-ken (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/103,278

(22) Filed: Mar. 21, 2002

(65) Prior Publication Data

US 2004/0076031 A1 Apr. 22, 2004

(51) Int. Cl.$^7$ .......................... G11C 11/22; G11C 11/24
(52) U.S. Cl. ...................... 365/145; 365/149
(58) Field of Search ............... 365/145, 149, 365/203, 222

(56) References Cited

U.S. PATENT DOCUMENTS

| | | | | |
|---|---|---|---|---|
| 5,691,935 A | * | 11/1997 | Douglass | 365/149 |
| 5,822,264 A | * | 10/1998 | Tomishima et al. | 365/222 |
| 5,903,492 A | * | 5/1999 | Takashima | 365/145 |
| 6,115,284 A | | 9/2000 | Matsumiya et al. | |
| 6,198,651 B1 | * | 3/2001 | Lee et al. | 365/145 |
| 6,208,550 B1 | | 3/2001 | Kim | |
| 6,363,002 B1 | * | 3/2002 | Nishimura et al. | 365/145 |
| 6,366,490 B1 | * | 4/2002 | Takeuchi et al. | 365/145 |
| 2002/0006053 A1 | | 1/2002 | Murakuki | |
| 2002/0031003 A1 | | 3/2002 | Hoya et al. | |

FOREIGN PATENT DOCUMENTS

JP        09 185890 A      7/1997

OTHER PUBLICATIONS

Fujisawa H. et al.: "The Charge-Share Modified (CSM) Precharge-Level Architecture for High-Speed and Low-Power Ferroelectric Memory" IEEE Journal of Solid-State Circuits, May 1997, USA, vol. 32, No. 5, pp 655-661.

"A Sub-40-ns Chain FRAM Architecture with 7-ns Cell-Plate-Line Drive", Daisaburo Takashima et al., IEEE Journal of Solid-State Circuits, Nov. 1999, p. 1557-1563, vol. 34, No. 11.

* cited by examiner

*Primary Examiner*—Trong Phan
(74) *Attorney, Agent, or Firm*—Horizon IP Pte Ltd

(57) ABSTRACT

Improved sensing of ferroelectric memory cells is disclosed. When a memory access is initiated, the bitlines are precharged to a negative voltage, for example, -0.5 to -1.0V. This increases the effective plateline pulse ($V_{PLH}$) to $V_{PLH}$+the magnitude of the negative voltage. This results in an increase in the difference between $V_{HI}$ and $V_{LO}$ read signals, thereby increasing the sensing window.

32 Claims, 5 Drawing Sheets

INCREASING THE READ SIGNAL IN FERROELECTRIC MEMORIES

FIELD OF THE INVENTION

The present invention relates to ferroelectric memory integrated circuits (ICs). More particularly, the invention relates to increasing the read signal in ferroelectric memory ICs.

BACKGROUND OF THE INVENTION

Ferroelectric metal oxide ceramic materials such as lead zirconate titanate (PZT) have been investigated for use in ferroelectric semiconductor memory devices. Other ferroelectric materials, such as strontium bismuth tantalate (SBT), can also be used. FIG. 1 shows a conventional ferroelectric memory cell 105 having a transistor 130 and a ferroelectric capacitor 140. The capacitor comprises a ferroelectric metal ceramic layer sandwiched between first and second electrodes 141 and 142. The electrodes typically are formed from a noble metal such as platinum. Electrode 142 is coupled to a plateline 170 and electrode 141 is coupled to the transistor which selectively couples or decouples the capacitor from a bitline 160, depending on the state (active or inactive) of a wordline 150 coupled to the transistor gate. A plurality of cells are interconnected by PLs, BLs, and WLs to form an array.

The ferroelectric memory stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after electric field is removed, resulting in a non-volatile memory cell.

During standby, the two electrodes of the capacitor are maintained at the same potential. To perform a read, the bitline of the memory cell is precharged to 0V. The wordline is activated, coupling the capacitor to the bitline. A pulse is provided on the plateline, resulting in a read signal on the bitline. If the pulse switches the polarization of the capacitor, a relatively big charge flows to the bitline which results in a voltage $V_{HI}$. On the other hand, a relatively small charge flows to the bitlines to produce $V_{LO}$ if the polarization is not switched. The magnitude of the read signal depends on ratio of the capacitance of the cell capacitor and bitline capacitance. Typically, $V_{LO}$ is about 0.6V and $V_{HI}$ is about 1.2V, resulting in a small difference between the two levels. Since a sense amplifier needs to differentiate between the two signal levels, it is desirable to provide as large a difference between the levels as possible to increase the sensing window. Increased sensing window reduces read defects, thus increasing yield.

Conventionally, increasing the difference between the read signals $V_{LO}$ and $V_{HI}$ is achieved by increasing the magnitude of the pulse signal on the plateline. However, increasing the pulse signal can adversely impact the reliability and performance of the IC. For example, large pulse signals can decrease gate oxide reliability, increase power consumption, and decrease pulse signal speed.

From the foregoing discussion, it is desirable to increase sensing window in ferroelectric memory ICs without decreasing reliability or performance.

SUMMARY OF THE INVENTION

The invention relates to improving the sensing window by increasing the differential of the high/low read signals in ICs with an array of ferroelectric memory cells. In one embodiment, the ferroelectric memory cells are arranged in a folded bitline architecture. Alternatively, the memory cells are arranged in a chained architecture. A sense circuit is coupled to the bitlines of the memory array. A voltage source which provides a negative voltage is coupled to the sense circuit. When a memory access is initiated, the sense amplifier precharges the bitlines to the negative voltage. By precharging the bitlines to a negative voltage, the effective plateline pulse ($V_{PLH}$) is increased to about $V_{PLH}+V_{BLN}$. This results in an increase in the difference between $V_{HI}$ and $V_{LO}$ read signals, thereby increasing the sensing window.

DETAILED DESCRIPTION OF THE INVENTION

The invention generally relates to increasing read signal in ferroelectric memory ICs. Increasing the read signal produces a larger differential between the logic 1 and logic 0 signal levels, which advantageously increases the sensing window of the sense amplifiers.

Figure 1:
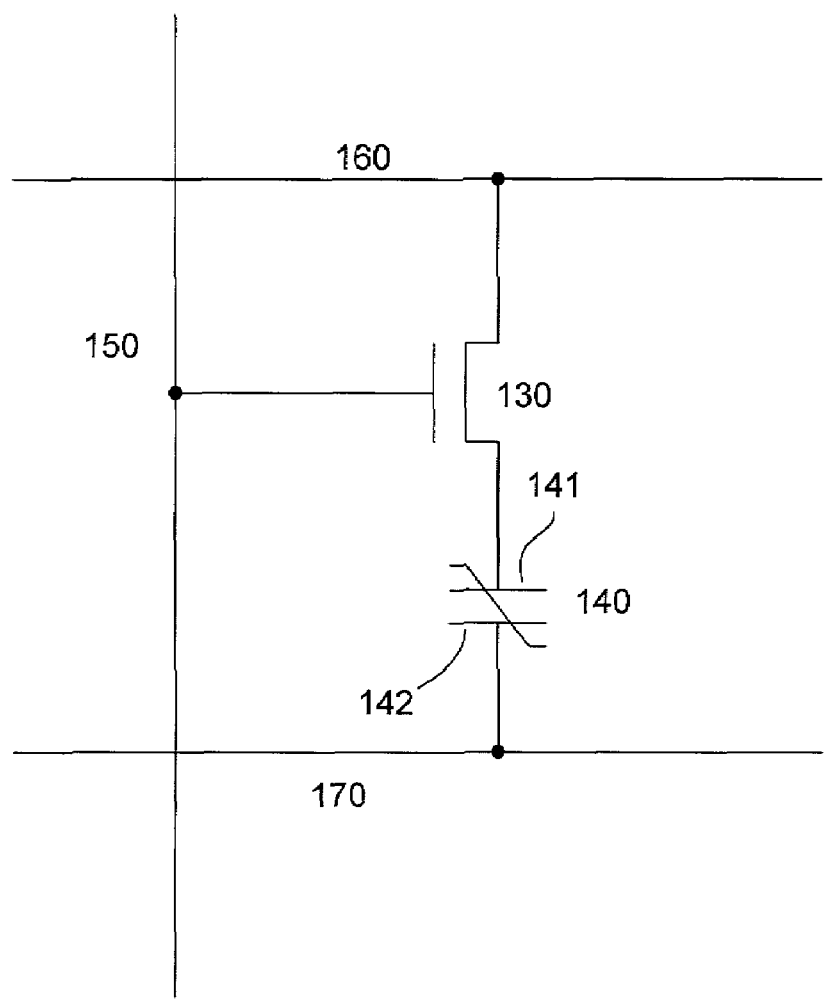
FIG. 1 shows a conventional ferroelectric memory cell.
Figure 2:
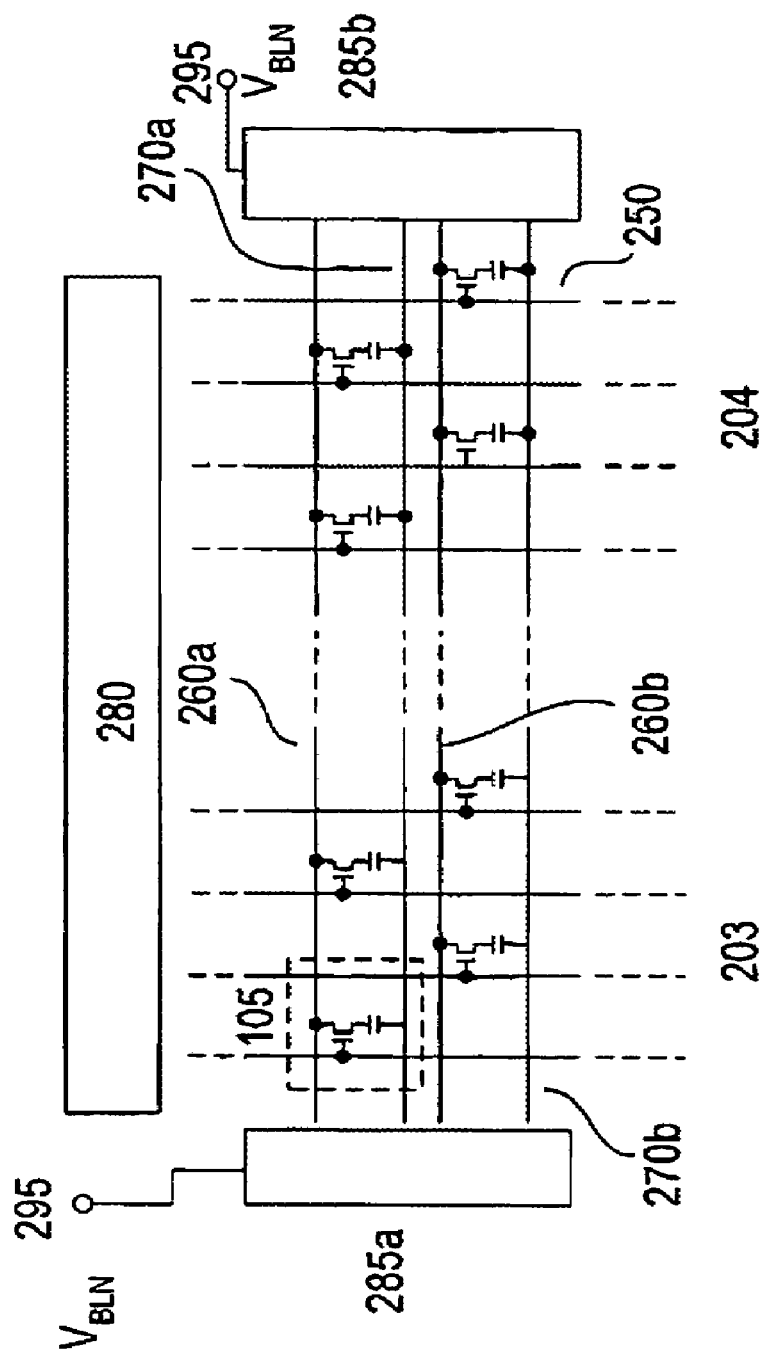
FIGS. 2–3 show a column of a ferroelectric memory block in accordance with various embodiments of the invention.

FIG. 2 shows a portion 200 of a ferroelectric memory IC in accordance with one embodiment of the invention. As shown, the portion includes a bitline pair 260 of an array which is configured in a folded bitline architecture. Other types of bitline architectures, such as open, are also useful. A bitline pair includes first and second bitlines 260a–b. An array comprises a plurality of bitline pairs, intersected by a plurality of wordlines 250. Typically, one bitline is referred to as the bitline true and the other is referred to as the bitline complement. In one embodiment, the bitlines are separated into first (left) and second (right) sections (or blocks) 203 and 204. Memory cells 105 are located in alternate intersections between wordlines and bitlines. Within a bitline pair, a wordline selects one memory cell.

A wordline driving circuit 280 is coupled to the wordlines and a sensing circuit 285 is coupled to an end of the bitlines. In one embodiment, first and second sensing circuits 285a–b are provided for respective first and second bitline sections of the array. In accordance with one embodiment of the invention, a negative voltage source 295 ($V_{BLN}$) is coupled to the sensing circuits. The sensing circuit includes, for example, sense amplifiers and precharging circuitry. The wordline driving circuit is controlled by row decoder and sensing circuits are controlled by column decoders. A plateline driving circuit is coupled to the platelines. A plateline decoder, for example, can be employed to control the plateline driving circuit. Alternatively, depending on which direction the platelines are arranged, either the row or column decoder can be used to control the plateline driving circuit.

Figure 3:
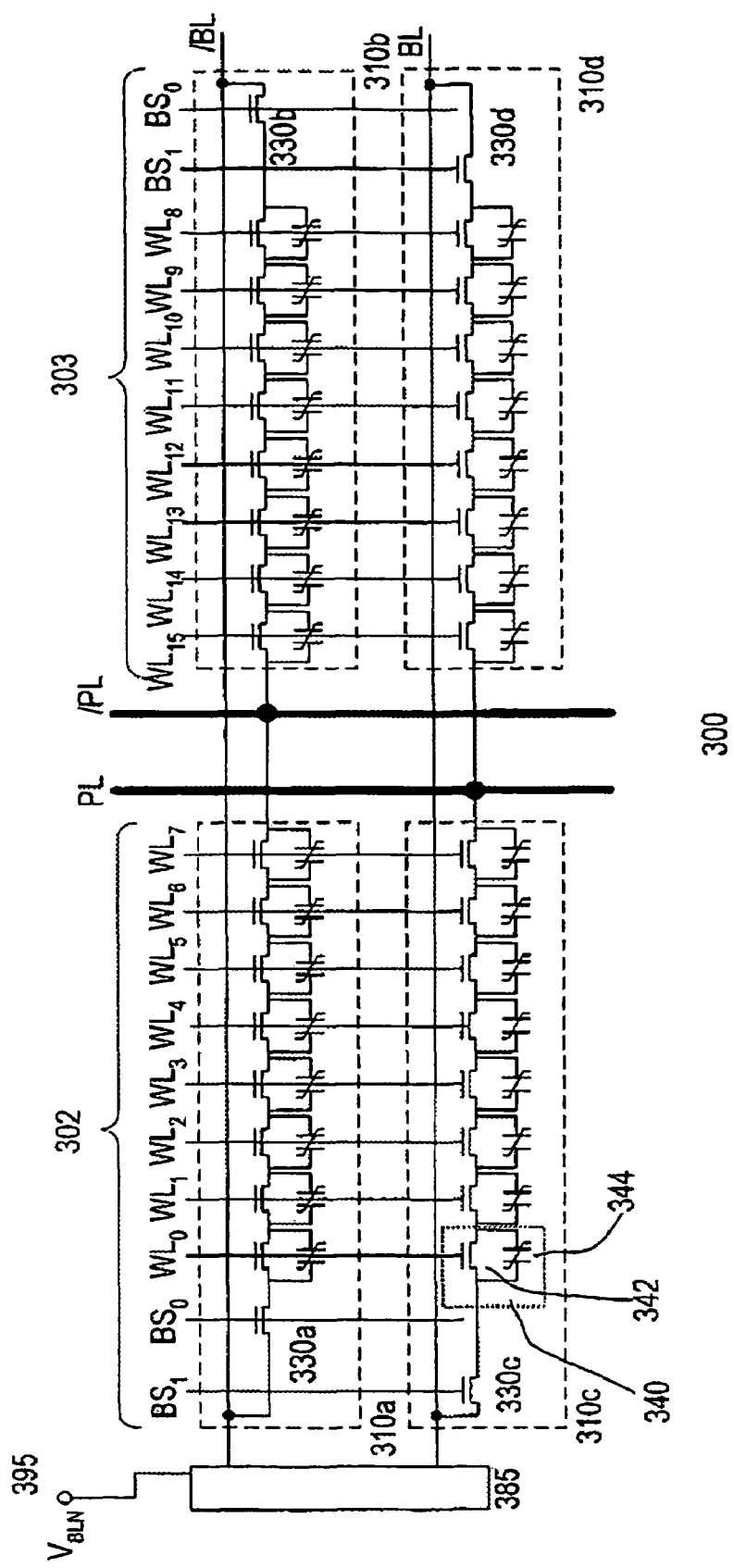

FIG. 3 shows a portion of a memory IC in accordance with another embodiment of the invention. As shown, the portion includes a pair of bitlines (bitline BL and bitline complement /BL). Each of the bitlines includes first and second groups of memory cells 310a–b or 310c–d) arranged in a series architecture. Such a memory architecture is described in, for example, "A Sub-40 ns Chain FRAM Architecture with 7 ns Cell-Plate-Line Drive", IEEE JOURNAL OF SOLID-STATE CIRCUITS. VOL. 34. NO. 11, which is herein incorporated by reference for all purposes. The memory cells of a group, each with a transistor 342 coupled to a capacitor in parallel, are coupled serially. The gates of the cell transistors are coupled to wordlines (WL). A selection transistor 330 is provided to selectively couple one end of a memory group to a bitline while the other end is commonly coupled to the other memory group of the bitline and a plateline (PL or /PL). The selection transistors for the memory chains of the same bitline are controlled by block select signal (BS) according to the selected wordline. PL is coupled to the memory groups of BL while /PL is coupled to the memory groups of /BL.

Numerous bitline pairs are interconnected via wordlines to form a memory block. The memory block is separated into first (left) and second (right) sections 302 and 303, each comprising a chain of a bitline. During a memory access, only one section is accessed (either left or right). Depending on which bitline the memory chain of the selected cell is located, BS0 or BS1 is activated.

A wordline driving circuit is coupled to the wordlines and a sensing circuit is coupled to an end of the bitlines. A sense circuit is coupled to one end of the bitlines. The sensing circuit 385 includes, for example, sense amplifiers and precharging circuitry. In accordance with one embodiment of the invention, a negative voltage source 395 ($V_{BLN}$) is coupled to the sensing circuits. The wordline driving circuit is controlled by row decoder and sensing circuit are controlled by column decoders.

In accordance with the invention, the read signal is increased by precharging the bitlines to a negative voltage $V_{BLN}$. In one embodiment, $V_{BLN}$ has about the same magnitude as $V_{LO}$. In one embodiment, $V_{BLN}$ is equal to about −0.5V to −1.0V. Preferably, $V_{BLN}$ causes $V_{LO}$ to equal to about 0V or slightly above 0V, ensuring that the read voltage is not a negative voltage. By providing a negative $V_{BLN}$, the effective magnitude of the pulse on PL is increased from $V_{PLH}$ to about $V_{PLH}+V_{BLN}$ without increasing $V_{PLH}$. This results in an increase in the difference between $V_{HI}$ and $V_{LO}$ without adversely affecting the reliability and performance of the IC. The bitlines are precharged using the bitline precharge circuitry which, for example, is part of sense amplifiers which are coupled to the bitlines.

Figure 4:
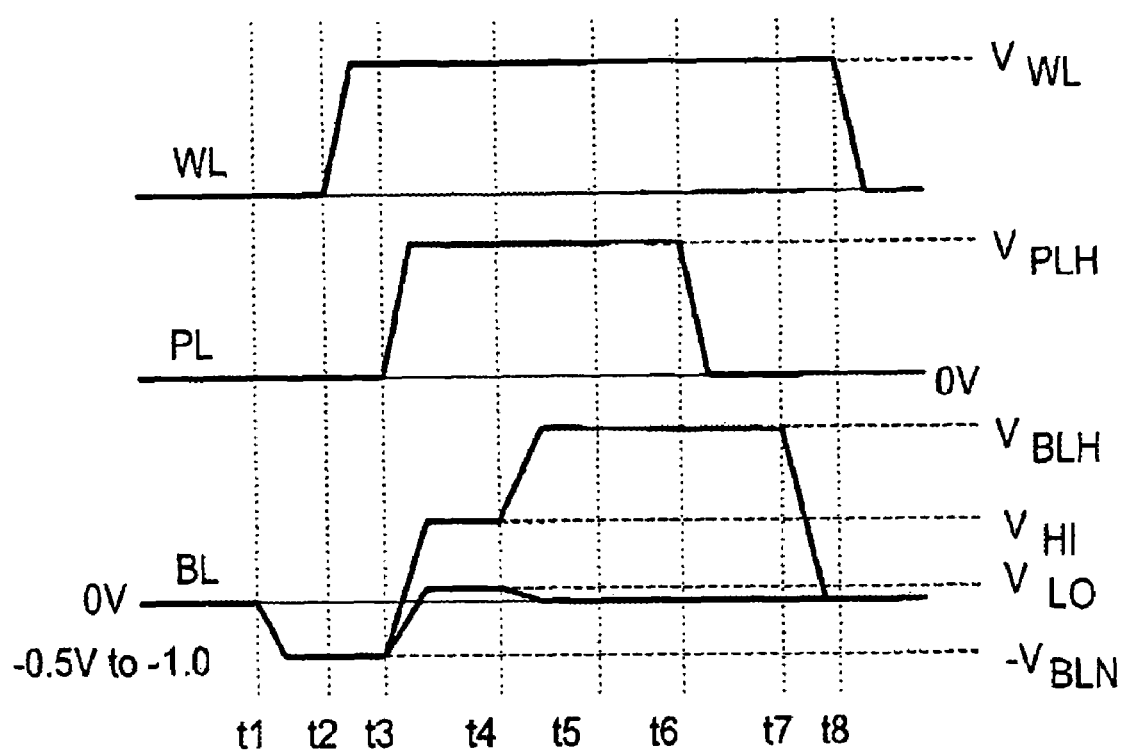
FIGS. 4–5 show timing diagrams for read and write accesses, respectively, in accordance with one embodiment of the invention.

FIG. 4 shows a timing diagram of the memory IC during read access in accordance with one embodiment of the invention. During standby the bitlines are precharged to 0V. When a memory read access is initiated at t1, the bitline is precharged to $V_{BLN}$. At t2 the word line corresponding to the address is activated. A pulse $V_{PLH}$ is provided on the plateline at t3. The pulse creates an electric field across the capacitor of the selected memory cell. Depending on whether the electric field switches the polarity of the capacitor or not, $V_{HI}$ or $V_{LO}$ is on the bitlines. At t4, the sense amplifier is activated, driving the bitlines to $V_{BLH}$ if $V_{HI}$ was on the bitlines or 0V if $V_{LO}$ was on the bitlines. The data is read from the sense amplifier at t5. For write back of the data, the plateline is pulled to 0V at t6. The bitlines are precharged to 0V at t7 and the wordline is deactivated at t8, completing the read access.

Figure 5:
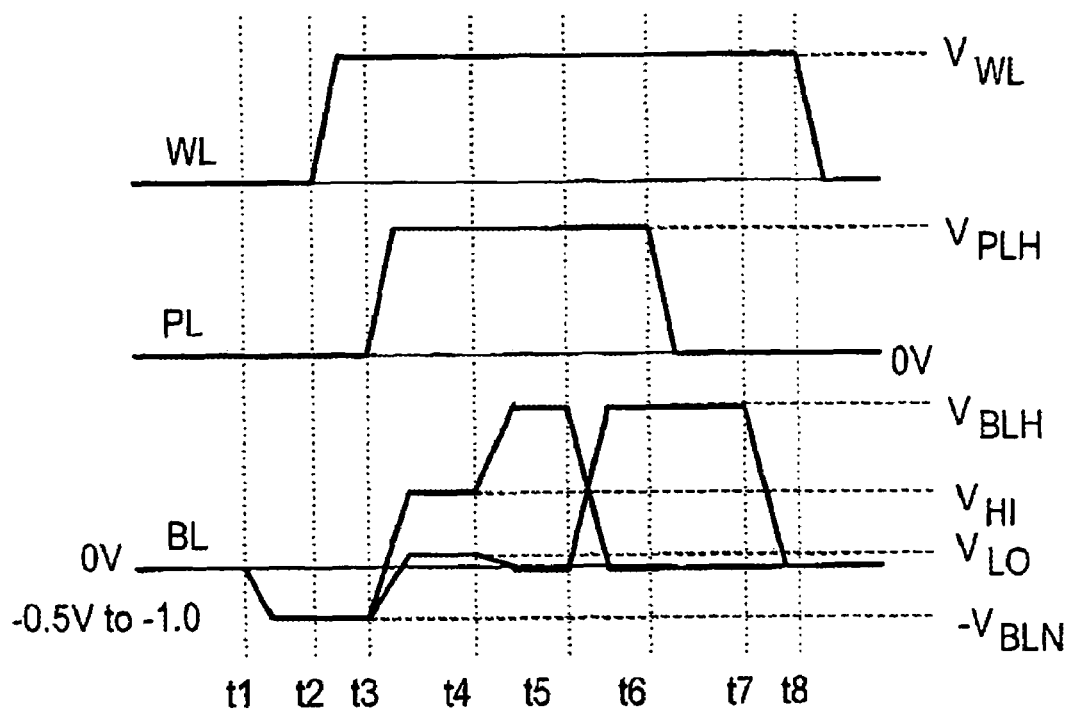

FIG. 5 shows a timing diagram of a write access in accordance with one embodiment of the invention. The write access is generally the same as the read access except that instead of reading out the data at t5, the sense amplifier latch is flipped according to the data to be written into the memory cell.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit (IC) comprising:
   an array of ferroelectric memory cells interconnected by platelines, bitlines and wordlines, the wordlines coupled to gates of access transistors of the memory cells, bitlines coupled to first terminals of the access transistors and platelines coupled to first plates of capacitors of the memory cells;
   a sense circuit coupled to the bitlines; and
   a voltage source coupled to the sense circuit, the voltage source provides a negative voltage for the sense circuit to precharge the bitlines to a negative precharge voltage level for a memory access to access memory cells in the memory array for data retrieval or data storage, wherein at least the bitline associated with a selected memory cell to be accessed is precharged to the negative precharge voltage level to increase an effective magnitude of a plateline voltage on at least a plateline associated with the selected memory cell to increase a read signal from the selected memory cell.

2. The IC of claim 1 wherein the array of ferroelectric memory cells is configured in a folded-bitline architecture.

3. The IC of claim 1 wherein the array of ferroelectric memory cells is configured in a series architecture.

4. The IC of claim 1 wherein a selected memory cell causes a read voltage equal to $V_{LO}$ or $V_{HI}$ on the bitline to which the selected memory cell is coupled, depending on the polarity of capacitor of the selected memory cell.

5. The IC of claim 4 wherein the negative voltage is equal to about −0.5 to −1.0V.

6. The IC of claim 5 wherein the negative voltage causes $V_{LO}$ to be equal to about 0V.

7. The IC of claim 4 wherein the negative voltage causes $V_{LO}$ to be equal to about 0V.

8. The IC of claim 2 wherein a selected memory cell causes a read voltage equal to $V_{LO}$ or $V_{HI}$ on the bitline to which the selected memory cell is coupled, depending on the polarity of capacitor of the selected memory cell.

9. The IC of claim 8 wherein the negative voltage is equal to about −0.5 to −1.0V.

10. The IC of claim 9 wherein the negative voltage causes $V_{LO}$ to be equal to about 0V.

11. The IC of claim 8 wherein the negative voltage causes $V_{LO}$ to be equal to about 0V.

12. The IC of claim 3 wherein a selected memory cell causes a read voltage equal to $V_{LO}$ or $V_{HI}$ on the bitline to which the selected memory cell is coupled, depending on the polarity of capacitor of the selected memory cell.

13. The IC of claim 12 wherein the negative voltage is equal to about −0.5 to −1.0V.

14. The IC of claim 13 wherein the negative voltage causes $V_{LO}$ to be equal to about 0V.

15. The IC of claim 12 wherein the negative voltage causes $V_{LO}$ to be equal to about 0V.

16. An integrated circuit (IC) comprising:
an array of memory cells interconnected by platelines, bitlines and wordlines, the wordlines coupled to gates of access transistors of the memory cells, bitlines coupled to first terminals of the access transistors and platelines coupled to first plates of capacitors of the memory cells;
a sense circuit coupled to the bitlines; and
a voltage source coupled to the sense circuit, the voltage source provides a negative voltage for the sense circuit to precharge the bitlines to a negative precharge voltage level for a memory access to access memory cells in the memory array for data retrieval or data storage, wherein at least the bitline associated with a selected memory cell to be accessed is precharged to the negative precharge voltage level to increase an effective magnitude of a plateline voltage on at least a plateline associated with the selected memory cell to increase a read signal from the selected memory cell.

17. The IC of claim 16 wherein a selected memory cell causes a read voltage equal to $V_{LO}$ or $V_{HI}$ on the bitline to which the selected memory cell is coupled, depending on the information stored in the capacitor of the selected memory cell.

18. The IC of claim 17 wherein the negative voltage is equal to about −0.5 to −1.0V.

19. The IC of claim 17 wherein the negative voltage causes $V_{LO}$ to be equal to about 0V.

20. The IC of claim 19 wherein the negative voltage is equal to about −0.5 to −1.0V.

21. An integrated circuit (IC) comprising:
an array of ferroelectric memory cells interconnected by platelines, bitlines and wordlines, the wordlines coupled to gates of access transistors of the memory cells, bitlines coupled to first terminals of the access transistors and platelines coupled to first plates of capacitors of the memory cells;
a sense circuit coupled to the bitlines;
a voltage source coupled to the sense circuit, the voltage source provides a negative voltage for the sense circuit to precharge the bitlines to a negative precharge voltage level for a memory access to access memory cells in the memory array for data retrieval or data storage, wherein at least the bitline associated with a selected memory cell to be accessed is precharged to the negative precharge voltage level to increase an effective magnitude of a plateline voltage on at least a plateline associated with the selected memory cell to increase a read signal from the selected memory cell; and
wherein the selected memory cell causes a read voltage equal to $V_{LO}$ or $V_{HI}$ on the bitline to which the selected memory cell is coupled, depending on the information stored in the capacitor of the selected memory cell.

22. The IC of claim 21 wherein the negative voltage is equal to about −0.5 to −1.0V.

23. The IC of claim 21 wherein the negative voltage causes $V_{LO}$ to be equal to about 0V.

24. The IC of claim 23 wherein the negative voltage is equal to about −0.5 to −1.0V.

25. A method of operating an integrated circuit (C) comprising:
providing an array of memory cells interconnected by platelines, wordlines and bitlines, the wordlines coupled to gates of access transistors of the memory cells, bitlines coupled to first terminals of the access transistors and platelines coupled to first plates of capacitors of the memory cells, wherein bitlines are grouped into bitline pairs, each coupled to a sense amplifier circuit;
precharging the bitlines to a negative precharge voltage level for a memory access to access memory cells in the memory array for data retrieval or data storage wherein precharging the bitlines precharges at least the bitline associated with a selected memory cell to be accessed to increase an effective magnitude of a plateline voltage on at least a plateline associated with the selected memory cell to increase a read signal from the selected memory cell; and
accessing the selected memory cell from one of the bitline pairs, the selected memory cell causing a read voltage equal to $V_{LO}$ or $V_{HI}$ on the bitline to which the selected memory cell is coupled depending on the information stored in the selected memory cell.

26. The method of claim 25 wherein the negative voltage is equal to about −0.5 to −1.0V.

27. The method of claim 25 wherein the negative voltage causes $V_{LO}$ to be equal to about 0V.

28. The method of claim 27 wherein the negative voltage is equal to about−0.5 to −1.0V.

29. The method of claim 25 wherein the memory comprises ferroelectric memory cells.

30. The method of claim 29 wherein the negative voltage is equal to about −0.5 to −1.0V.

31. The method of claim 29 wherein the negative voltage causes $V_{LO}$ to be equal to about 0V.

32. The method of claim 31 wherein the negative voltage is equal to about −0.5 to −1.0V.

* * * * *